(12) United States Patent
Monroe et al.

(10) Patent No.: US 6,914,709 B2
(45) Date of Patent: Jul. 5, 2005

(54) MEMS DEVICE AND METHOD OF FORMING MEMS DEVICE

(75) Inventors: Michael G. Monroe, Corvallis, OR (US); Eric L. Nikkel, Philomath, OR (US); Michele K. Szepesi, Salem, OR (US); Stephen J. Potochnik, Corvallis, OR (US); Richard P. Tomasco, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/677,825

(22) Filed: Oct. 2, 2003

(65) Prior Publication Data

US 2005/0073735 A1 Apr. 7, 2005

(51) Int. Cl.[7] .............................................. G02B 26/00
(52) U.S. Cl. .................... 359/290; 359/223; 359/295
(58) Field of Search .......................... 359/290–91, 295, 359/302, 223–26, 212–14, 849–50; 439/520; 310/36; 430/311, 315, 322, 317, 324

(56) References Cited

U.S. PATENT DOCUMENTS

| | | | |
|---|---|---|---|
| 5,485,304 A | 1/1996 | Kaeriyama | 359/291 |
| 5,583,688 A | 12/1996 | Hornbeck | 359/291 |
| 5,631,782 A | 5/1997 | Smith et al. | 359/871 |

(Continued)

FOREIGN PATENT DOCUMENTS

| | | |
|---|---|---|
| EP | 1093143 | 4/2001 |
| JP | 2000314634 | 7/2001 |

OTHER PUBLICATIONS

Bikram Baidaya et al., "Layout Verification and Correction of CMOS–MEMS Layouts", Carnegie Mellon University, Pittsburgh.

Jeffrey D. Zahn et al., A Direct Plasma Etch Approach to High Aspect Ratio Polymer Micromachining With Applications in Biomems and CMOS–MEMS, 2002 IEEE, pp. 137–140.

Jim Hunter et al., "CMOS friendly MEMS manufacturing process", 1998 IEEE, pp. 103–104.

J.H. Smith et al., "Material and Processing Issues for the Monolithic Integration of Microelectronics with Surface–Micromachined Polysilicon Sensors and Actuators" SPIE, Oct. 1995, pp. 1–10.

Oliver Brand, "CMOS–based MEMS/DTU PhD Course/Topics in Microelectronics", Physical Electronics Laboratory, ETH Zurich, http://www.iqe.ethz.ch/pel, slides A–2 through A–36.

J.H. Smith et al., "Embedded Micromechanical Devices for the Monolithic Integration of MEMS with CMOS", 1995 IEEE, pp. 609–612.

*Primary Examiner*—Jordan M. Schwartz
*Assistant Examiner*—Jessica Stultz

(57) ABSTRACT

A method of forming a MEMS device includes providing a substructure including a base material and at least one conductive layer formed on a side of the base material, forming a dielectric layer over the at least one conductive layer of the substructure, defining an actuating area for the MEMS device on the dielectric layer, including depositing a conductive material on the dielectric layer and communicating the conductive material with the at least one conductive layer of the substructure through the dielectric layer, forming a sacrificial layer over the conductive material and the dielectric layer, including depositing silicon over the conductive material and the dielectric layer, and forming a substantially planar surface of the silicon, forming an actuating element over the sacrificial layer within the actuating area, including communicating the actuating element with the conductive material of the actuating area through the sacrificial layer, and substantially removing the sacrificial layer between the actuating element and the dielectric layer.

31 Claims, 11 Drawing Sheets

U.S. PATENT DOCUMENTS

| | | | |
|---|---|---|---|
| 5,646,768 A | 7/1997 | Kaeriyama | 359/224 |
| 5,650,881 A | 7/1997 | Hornbeck | 359/871 |
| 5,703,728 A | 12/1997 | Smith et al. | 359/871 |
| 5,919,548 A | 7/1999 | Barron et al. | 428/138 |
| 6,025,951 A | 2/2000 | Swart et al. | 359/245 |
| 6,038,056 A | 3/2000 | Florence et al. | 359/290 |
| 6,121,552 A | 9/2000 | Brosnihan et al. | 174/253 |
| 6,323,982 B1 | 11/2001 | Hornbeck | 359/224 |
| 6,396,368 B1 | 5/2002 | Chow et al. | 333/262 |
| 6,440,766 B1 | 8/2002 | Clark | 438/52 |
| 6,469,330 B1 | 10/2002 | Vigna et al. | 257/254 |
| 6,480,320 B2 | 11/2002 | Nasiri | 359/291 |
| 6,504,643 B1 * | 1/2003 | Peeters et al. | 359/224 |
| 6,523,961 B2 | 2/2003 | Ilkov et al. | 353/99 |
| 6,735,004 B1 * | 5/2004 | Hagelin et al. | 359/198 |
| 2002/0039470 A1 | 4/2002 | Braun et al. | 385/50 |
| 2002/0117728 A1 * | 8/2002 | Brosnihhan et al. | 257/446 |
| 2003/0034535 A1 | 2/2003 | Barenburg et al. | 257/415 |
| 2003/0174934 A1 * | 9/2003 | Ishii et al. | 385/18 |

* cited by examiner

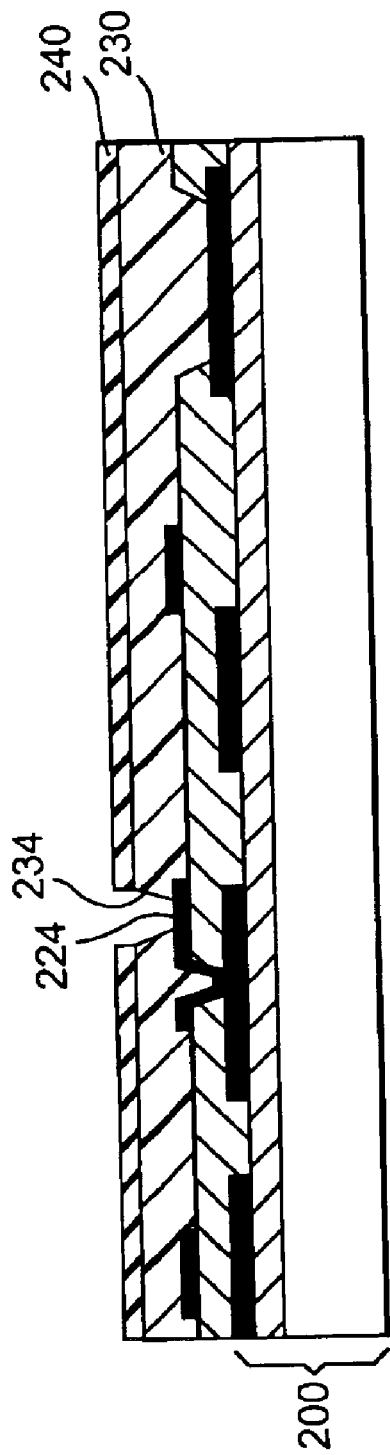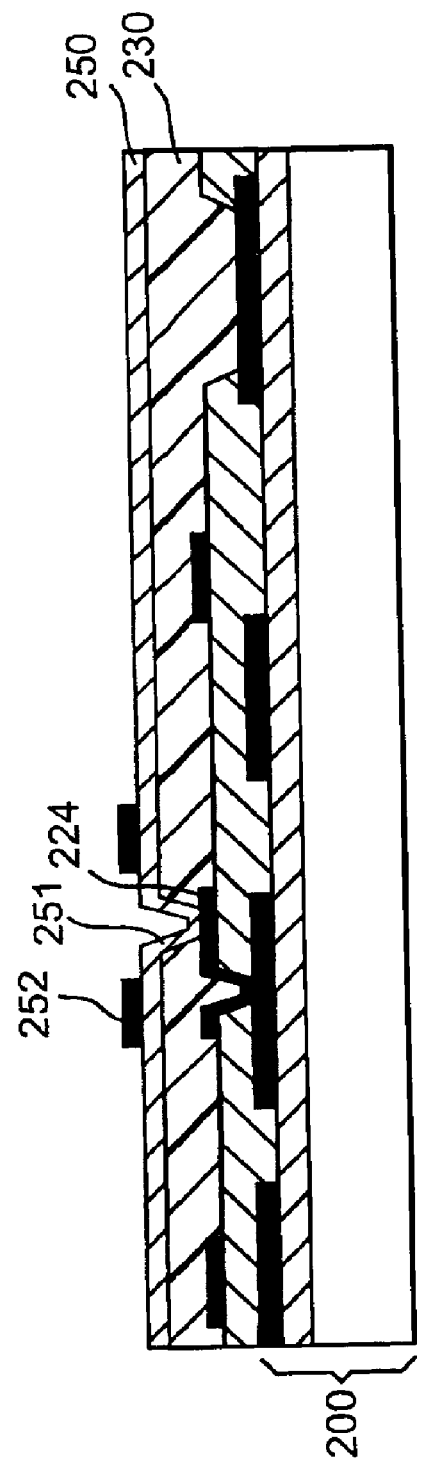

MEMS DEVICE AND METHOD OF FORMING MEMS DEVICE

BACKGROUND

Microelectromechanical systems or MEMS devices include micromachined substrates integrated with electronic microcircuits. Such devices may form, for example, microsensors or microactuators which operate based on, for example, electromagnetic, electrostrictive, thermoelectric, piezoelectric, or piezoresistive effects. MEMS devices have been formed on insulators or other substrates using microelectronic techniques such as photolithography, vapor deposition, and etching.

An example of a MEMS device includes a micro-mirror device. The micro-mirror device can be operated as a light modulator for amplitude and/or phase modulation of incident light. One application of a micro-mirror device is in a display system. As such, multiple micro-mirror devices are arranged in an array such that each micro-mirror device provides one cell or pixel of the display. A conventional micro-mirror device includes an electrostatically actuated mirror supported for rotation about an axis of the mirror. As such, rotation of the mirror about the axis may be used to modulate incident light by directing the incident light in different directions.

Conventional techniques for forming a micro-mirror device include photolithography, vapor deposition, and etching. Thus, to reduce cost of the micro-mirror device, it is desirable to minimize the number of processing steps and/or reduce processing time. In addition, to minimize processing limitations, such as processing temperatures, it is also desirable to increase the number of materials which are suitable for use while forming the micro-mirror device.

For these and other reasons, there is a need for the present invention.

SUMMARY

One aspect of the present invention provides a method of forming a MEMS device. The method includes providing a substructure including a base material and at least one conductive layer formed on a side of the base material, forming a dielectric layer over the at least one conductive layer of the substructure, defining an actuating area for the MEMS device on the dielectric layer, including depositing a conductive material on the dielectric layer and communicating the conductive material with the at least one conductive layer of the substructure through the dielectric layer, forming a sacrificial layer over the conductive material and the dielectric layer, including depositing silicon over the conductive material and the dielectric layer, and forming a substantially planar surface of the silicon, forming an actuating element over the sacrificial layer within the actuating area, including communicating the actuating element with the conductive material of the actuating area through the sacrificial layer, and substantially removing the sacrificial layer between the actuating element and the dielectric layer.

BRIEF DESCRIPTION OF THE DRAWINGS

FIGS. 3A–3G illustrate one embodiment of forming a micro-mirror device according to the present invention.

DETAILED DESCRIPTION

In the following detailed description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
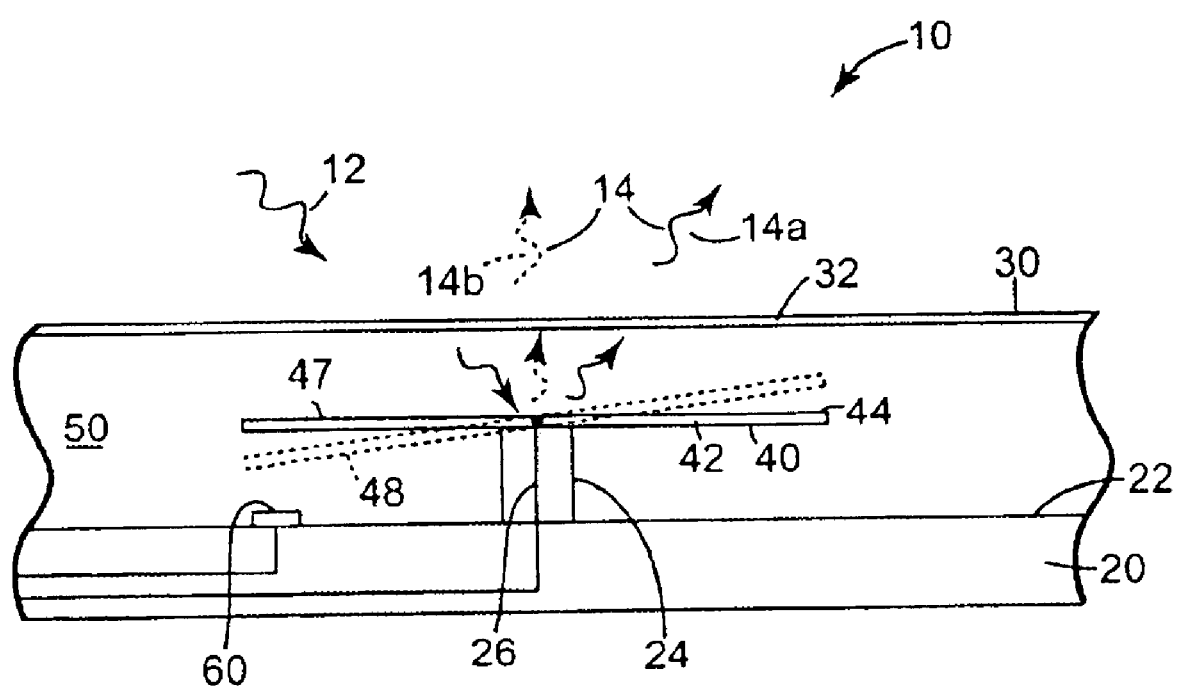
FIG. 1 is a schematic cross-sectional view illustrating one embodiment of a portion of a micro-mirror device according to the present invention.

FIG. 1 illustrates one embodiment of a micro-mirror device 10. Micro-mirror device 10 is a micro-actuator which relies on electrical to mechanical conversion to generate a force and cause movement or actuation of a body or element. In one embodiment, as described below, a plurality of micro-mirror devices 10 are arranged to form an array of micro-mirror devices. As such, the array of micro-mirror devices may be used to form a display. As such, each micro-mirror device 10 constitutes a light modulator for modulation of incident light and provides one cell or pixel of the display. In addition, micro-mirror device 10 may also be used in other imaging systems such as projectors and may also be used for optical addressing.

In one embodiment, as described below, micro-mirror device 10 is formed with a sacrificial silicon layer. As such, processing temperature limitations may be reduced since higher processing temperatures, compared to processing temperatures of other materials, can be used while forming micro-mirror device 10. Thus, the number of materials which are suitable for use while forming micro-mirror device 10 may be increased. In addition, in one embodiment, as described below, a reflective element of micro-mirror device 10 includes a hinge material and a reflective material formed on the hinge material such that the hinge material facilitates flexure or movement of the reflective element.

In one embodiment, as illustrated in FIG. 1, micro-mirror device 10 includes a substrate 20, a plate 30, and an actuating element 40. Preferably, plate 30 is oriented substantially parallel to a surface 22 of substrate 20 and spaced from surface 22 so as to define a cavity 50 therebetween. Actuating element 40 is interposed between surface 22 of substrate 20 and plate 30. As such, actuating element 40 is positioned within cavity 50. In one embodiment, actuating element 40 is supported relative to substrate 20 by a support or post 24 extending from surface 22 of substrate 20.

In one embodiment, actuating element 40 is actuated so as to move between a first position 47 and a second position 48 relative to substrate 20 and plate 30. Preferably, actuating element 40 moves or tilts at an angle about an axis of rotation. As such, first position 47 of actuating element 40 is illustrated as being substantially horizontal and substantially parallel to substrate 20 and second position 48 of actuating element 40 is illustrated as being oriented at an angle to first position 47. Movement or actuation of actuating element 40 relative to substrate 20 and plate 30 is described in detail below.

Preferably, plate 30 is a transparent plate 32 and actuating element 40 is a reflective element 42. In one embodiment, transparent plate 32 is a glass plate. Other suitable planar translucent or transparent materials, however, may be used. Examples of such a material include quartz and plastic.

Reflective element 42 includes a reflective surface 44. In one embodiment, reflective element 42 is formed of a uniform material having a suitable reflectivity to form reflective surface 44. Examples of such a material include polysilicon or a metal such as aluminum. In another embodiment, reflective element 42 is formed of a base material such as polysilicon with a reflective material such as aluminum or silver disposed on one or more sides of the base material. In addition, reflective element 42 may be formed of a non-conductive material or may be formed of or include a conductive material.

As illustrated in the embodiment of FIG. 1, micro-mirror device 10 modulates light generated by a light source (not shown) located on a side of transparent plate 32 opposite of substrate 20. The light source may include, for example, ambient and/or artificial light. As such, input light 12, incident on transparent plate 32, passes through transparent plate 32 into cavity 50 and is reflected by reflective surface 44 of reflective element 42 as output light 14. Thus, output light 14 passes out of cavity 50 and back through transparent plate 32.

The direction of output light 14 is determined or controlled by the position of reflective element 42. For example, with reflective element 42 in first position 47, output light 14 is directed in a first direction 14a. However, with reflective element 42 in second position 48, output light 14 is directed in a second direction 14b. Thus, micro-mirror device 10 modulates or varies the direction of output light 14 generated by input light 12. As such, reflective element 42 can be used to steer light into, and/or away from, an optical imaging system.

In one embodiment, first position 47 is a neutral position of reflective element 42 and represents an "ON" state of micro-mirror device 10 in that light is reflected, for example, to a viewer or onto a display screen, as described below. Thus, second position 48 is an actuated position of reflective element 42 and represents an "OFF" state of micro-mirror device 10 in that light is not reflected, for example, to a viewer or onto a display screen.

In one embodiment, reflective element 42 is moved between first position 47 and second position 48 by applying an electrical signal to an electrode 60 formed on substrate 20. In one embodiment, electrode 60 is formed on surface 22 of substrate 20 adjacent an end or edge of reflective element 42. Application of an electrical signal to electrode 60 generates an electric field between electrode 60 and reflective element 42 which causes movement of reflective element 42 between first position 47 and second position 48. Preferably, when the electrical signal is removed from electrode 60, reflective element 42 persists or holds second position 48 for some length of time. Thereafter, restoring forces of reflective element 42 pull or return reflective element 42 to first position 47.

In one embodiment, a conductive via 26 is formed in and extends through post 24. Conductive via 26 is electrically coupled to reflective element 42 and, more specifically, conductive material of reflective element 42. As such, reflective element 42 is moved between first position 47 and second position 48 by applying an electrical signal to electrode 60 and reflective element 42. More specifically, electrode 60 is energized to one polarity and the conductive material of reflective element 42 is energized to an opposite polarity. Thus, application of an electrical signal of one polarity to electrode 60 and an electrical signal of an opposite polarity to reflective element 42 generates an electric field between electrode 60 and reflective element 42 which causes movement of reflective element 42 between first position 47 and second position 48.

In another embodiment, reflective element 42 is moved between first position 47 and second position 48 by applying an electrical signal to reflective element 42. More specifically, the electrical signal is applied to conductive material of reflective element 42 by way of conductive via 26 through post 24. As such, application of an electrical signal to reflective element 42 generates an electric field which causes movement of reflective element 42 between first position 47 and second position 48.

Additional embodiments of actuation of micro-mirror device 10 are described, for example, in U.S. patent application Ser. No. 10/136,719, filed on Apr. 30, 2002, entitled "Micro-Mirror Device", assigned to the assignee of the present invention and incorporated herein by reference.

Figure 2:
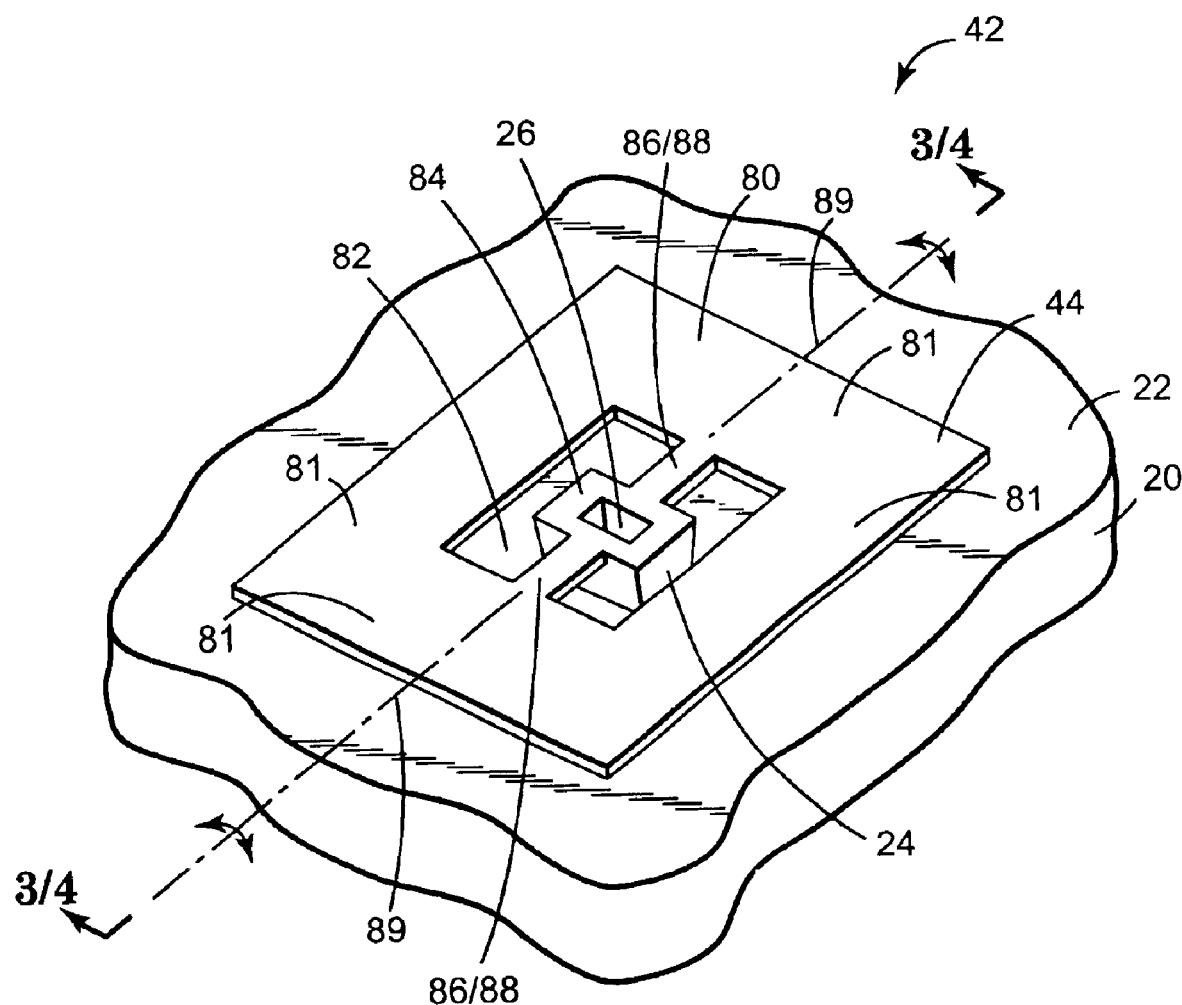
FIG. 2 is a perspective view illustrating one embodiment of a portion of a micro-mirror device according to the present invention.

FIG. 2 illustrates one embodiment of reflective element 42. Reflective element 42 has a reflective surface 44 and includes a substantially rectangular-shaped outer portion 80 and a substantially rectangular-shaped inner portion 84. In one embodiment, reflective surface 44 is formed on both outer portion 80 and inner portion 84. Outer portion 80 has four contiguous side portions 81 arranged to form a substantially rectangular-shaped opening 82. As such, inner portion 84 is positioned within opening 82. Preferably, inner portion 84 is positioned symmetrically within opening 82.

In one embodiment, a pair of hinges 86 extend between inner portion 84 and outer portion 80. Hinges 86 extend from opposite sides or edges of inner portion 84 to adjacent opposite sides or edges of outer portion 80. Preferably, outer portion 80 is supported by hinges 86 along an axis of symmetry. More specifically, outer portion 80 is supported about an axis that extends through the middle of opposed edges thereof. As such, hinges 86 facilitate movement of reflective element 42 between first position 47 and second position 48, as described above (FIG. 1). More specifically, hinges 86 facilitate movement of outer portion 80 between first position 47 and second position 48 relative to inner portion 84.

In one embodiment, hinges 86 include torsional members 88 having longitudinal axes 89 oriented substantially parallel to reflective surface 44. Longitudinal axes 89 are collinear and coincide with an axis of symmetry of reflective element 42. As such, torsional members 88 twist or turn about longitudinal axes 89 to accommodate movement of outer portion 80 between first position 47 and second position 48 relative to inner portion 84.

In one embodiment, reflective element 42 is supported relative to substrate 20 by support or post 24 extending from surface 22 of substrate 20. More specifically, post 24 supports inner portion 84 of reflective element 42, and outer portion 80 of reflective element 42 is supported by hinges 86 extending from inner portion 84. In one embodiment, post 24 is formed by conductive via 26 extending through inner portion 84 to a conductive layer of substrate 20.

Figure 3A:
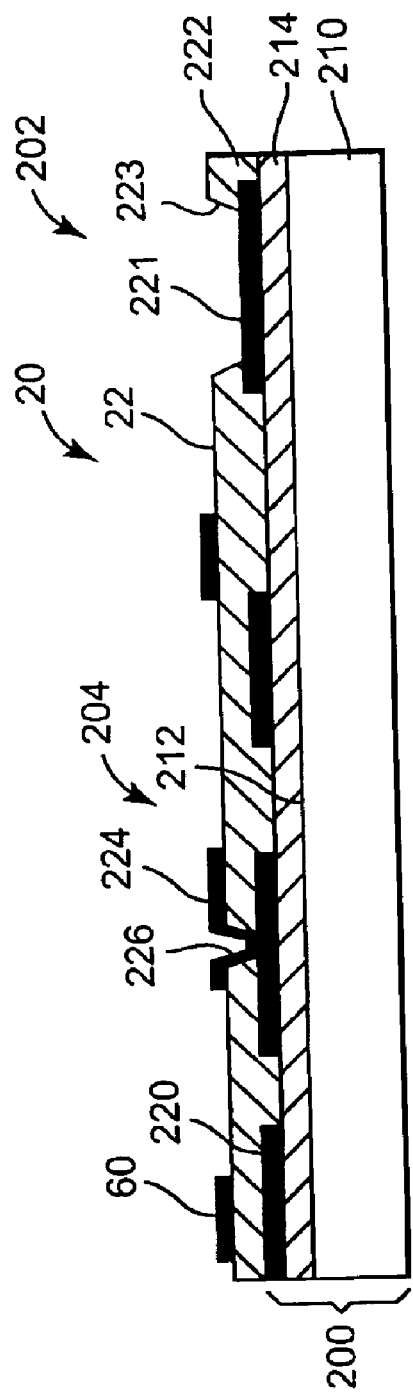

FIGS. 3A–3G illustrate one embodiment of forming micro-mirror device 10. In one embodiment, as illustrated in FIG. 3A, micro-mirror device 10 is formed on a substructure 200. In one embodiment, substructure 200 includes a complementary metal oxide semi-conductor (CMOS) structure. As such, substructure 200 includes a base material 210 and at least one conductive layer 220 formed on a first side 212 of base material 210. Conductive layer 220 includes, for example, titanium (Ti), titanium nitride (TiN), copper (Cu), gold (Au), and/or aluminum (Al). Conductive layer 220 is formed, for example, by deposition, and patterned by photolithography and etching.

In one embodiment, substructure 200 includes a dielectric layer 214 formed on first side 212 of base material 210. As such, conductive layer 220 of substructure 200 is formed over dielectric layer 214. Dielectric layer 214 includes, for example, a silicon oxide such as tetraethylorthosilicate (TEOS). In one embodiment, deposited layers of substructure 200 including, for example, dielectric layer 214 are planarized during formation of substructure 200 to create a substantially planar substrate for micro-mirror device 10.

In one embodiment, conductive material of conductive layer 220 forms an electrical contact area 202 of substructure 200 and an actuating area 204 of substructure 200. Electrical contact area 202 defines an area where electrical connection to micro-mirror device 10 is to be made, and actuating area 204 defines an area where actuating element 40 of micro-mirror device 10 is to be formed, as described below. As such, conductive layer 220 of substructure 200 constitutes an interconnect level of the CMOS circuit.

As illustrated in the embodiment of FIG. 3A, to form micro-mirror device 10 on substructure 200, a dielectric layer 222 is formed over conductive layer 220 of substructure 200. As such, dielectric layer 222 forms surface 22 of substrate 20, as described above. In one embodiment, dielectric layer 222 is formed by depositing a dielectric material over conductive layer 220. The dielectric material includes, for example, TEOS or other form of silicon oxide. In one embodiment, the dielectric material of dielectric layer 222 is planarized to create a substantially planar surface on which electrodes 60 are formed, as described below.

After dielectric layer 222 is formed over conductive layer 220, a conductive material 224 is deposited and patterned on dielectric layer 222. In one embodiment, conductive material 224 is deposited and patterned by photolithography and etching within actuating area 204 of substructure 200. As such, conductive material 224 defines electrode 60 on dielectric layer 222. In one embodiment, conductive material 224 includes aluminum or an aluminum alloy such as an aluminum silicon alloy.

In one embodiment, conductive material 224 communicates with conductive layer 220 of substructure 200 by a conductive via 226 formed through dielectric layer 222. It is understood that FIG. 3A is a schematic representation of substructure 200 and that the actual configuration of conductive layers and conductive vias formed between conductive layers may be more complicated than that illustrated.

In one embodiment, as illustrated in FIG. 3A, conductive material of conductive layer 220 is patterned to form an electrical contact pad 221 for micro-mirror device 10. Electrical contact pad 221 is formed, for example, in electrical contact area 202 of substructure 200. As such, an opening 223 is formed through dielectric layer 222 to electrical contact pad 221. Thus, electrical contact pad 221 provides a point for electrical connection for micro-mirror device 10.

Figure 3B:
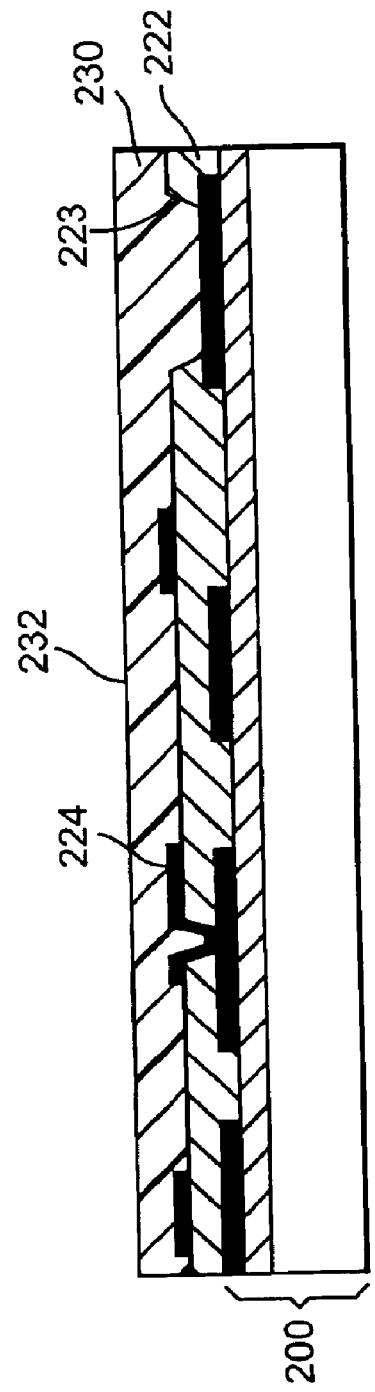

As illustrated in the embodiment of FIG. 3B, to form actuating element 40, a sacrificial layer 230 is formed over conductive material 224 and dielectric layer 222, including within opening 223. In one embodiment, sacrificial layer 230 is formed by depositing a sacrificial material over conductive material 224 and dielectric layer 222. The material forming sacrificial layer 230 is deposited, for example, by chemical vapor deposition (CVD) or plasma enhanced CVD (PECVD). In one embodiment, the material forming sacrificial layer 230 includes, for example, silicon.

Sacrificial layer 230 is sacrificial in that the material forming sacrificial layer 230 is substantially removed during subsequent processing while forming actuating element 40, as described below. By forming sacrificial layer 230 of silicon, for example, process temperature limitations are reduced since higher processing temperatures, compared to processing temperatures of other materials, can be used during processing of micro-mirror device 10.

After the material of sacrificial layer 230 is deposited over conductive material 224 and dielectric layer 222, the material is planarized to create a substantially flat or planar surface 232 of sacrificial layer 230. In one embodiment, the material of sacrificial layer 230 is planarized by a chemical mechanical polishing (CMP) process.

Next, as illustrated in the embodiment of FIG. 3C, a mask layer 240 is formed over sacrificial layer 230. In one embodiment, mask layer 240 is formed by deposition and patterned, for example, by photolithography or etching to expose an area of sacrificial layer 230 and define where an opening 234 is to be formed through sacrificial layer 230 to conductive material 224.

In one embodiment, opening 234 through sacrificial layer 230 is formed by chemical etching. Thus, mask layer 240 is formed of a material which is resistant to the etchant used for etching opening 234. Examples of a material suitable for mask layer 240 include a hard mask material such as silicon dioxide or silicon nitride, or a photoimageable material such as photoresist. After opening 234 is formed, mask layer 240 is stripped or removed.

As illustrated in the embodiments of FIGS. 3D-3G, after opening 234 is formed through sacrificial layer 230 and mask layer 240 is removed, actuating element 40 is formed. In one embodiment, actuating element 40 includes reflective element 42 of micro-mirror device 10. Reflective element 42 is formed, for example, by depositing one or more layers of one or more materials over sacrificial layer 230, and patterning the materials to define reflective element 42. The materials are deposited, for example, by physical vapor deposition (PVD), CVD, or PECVD, and patterned, for example, by photolithography and etching.

As illustrated in the embodiment of FIG. 3D, reflective element 42 is formed by depositing a first material 250 over sacrificial layer 230 and within opening 234 of sacrificial layer 230. In one embodiment, material 250 which is deposited within opening 234 forms a conductive via 251 through sacrificial layer 230 to conductive material 224. As such, conductive via 251 forms post 24 and conductive via 26 of micro-mirror device 10, as described above and illustrated in FIG. 1. Thus, material 250 includes a conductive material. In one embodiment, for example, material 250 includes aluminum or an aluminum alloy such as an aluminum silicon alloy. In addition, in one embodiment, material 250 constitutes a hinge material of reflective element 42 and forms hinges 86 (FIG. 2) of micro-mirror device 10, as described below.

In one embodiment, as illustrated in FIG. 3D, after material 250 is deposited over sacrificial layer 230, a protective material 252 is deposited and patterned on material 250. In one embodiment, protective material 252 is deposited by deposition and patterned by photolithography and etching to define where hinges 86 (FIG. 2) of micro-mirror device 10 are to be formed. More specifically, protective material 252 is patterned to protect areas of material 250 which form hinges 86, as described below. In one embodiment, protective material 252 includes TEOS or other form of silicon oxide.

Figure 3E:
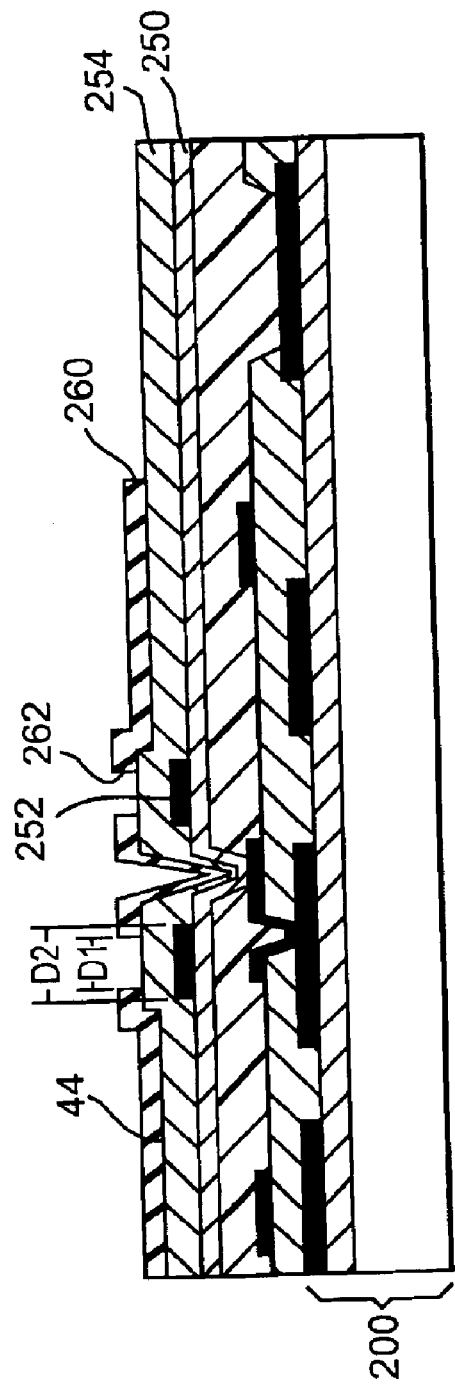

Next, as illustrated in the embodiment of FIG. 3E, reflective element 42 is further formed by depositing a second material 254 over protective material 252 and material 250. In one embodiment, material 254 constitutes reflective material of reflective element 42 and forms reflective surface 44 of reflective element 42. Thus, material 254 includes a reflective material. In one embodiment, for example, material 254 includes aluminum or an aluminum alloy such as an aluminum silicon alloy.

In one embodiment, as illustrated in FIG. 3E, after material 254 is deposited over protective material 252 and material 250, a mask layer 260 is formed over material 254. In one embodiment, mask layer 260 is formed by deposition and patterned, for example, by photolithography or etching to form openings 262 in mask layer 260 and expose areas of material 254. As such, the exposed areas of material 254 include areas which define where material 254 and protective material 252 are to be removed to form hinges 86 (FIG. 2) of reflective element 42. In one embodiment, a dimension D1 of openings 262 is less than a dimension D2 of protective material 252. As such, protective material 252 protects material 250 during forming of hinges 86, as described below.

Figure 3F:
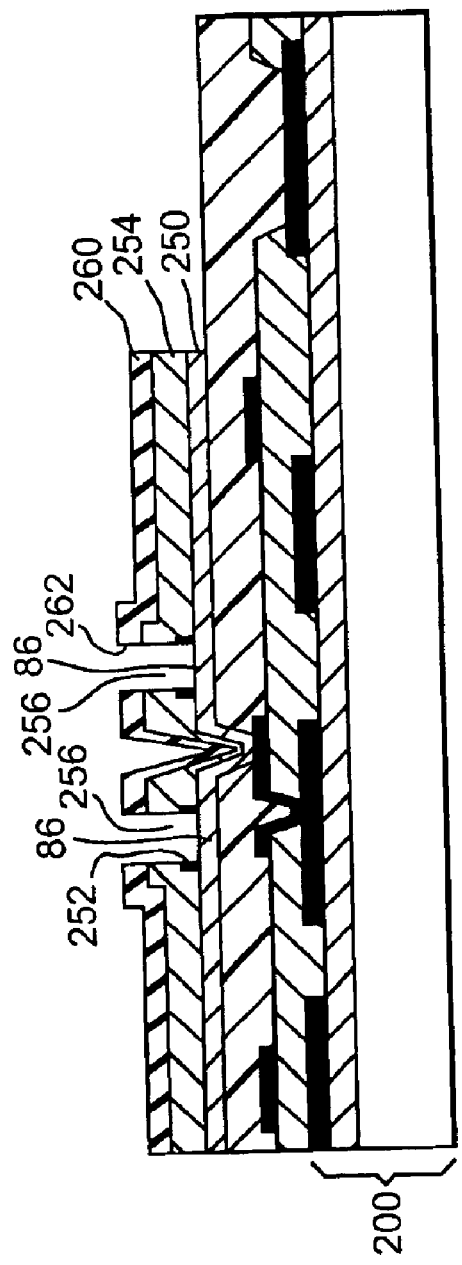

As illustrated in the embodiment of FIG. 3F, hinges 86 are formed by forming openings 256 through material 254 and protective material 252 to material 250. In one embodiment, openings 256 are formed by chemical etching through openings 262 of mask layer 260. As such, protective material 252 protects and/or controls etching into material 250. After openings 256 are formed, mask layer 260 is stripped or removed.

Figure 3G:
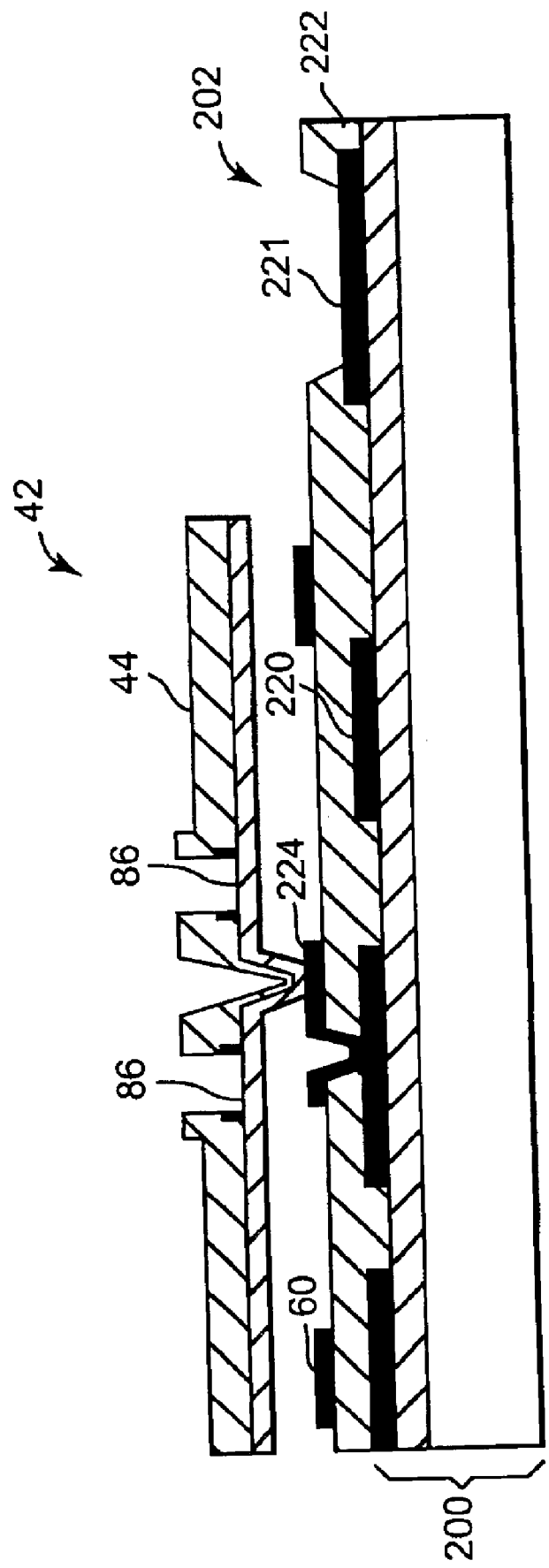

Next, as illustrated in the embodiment of FIG. 3G, sacrificial layer 230 is substantially removed. As such, the material of sacrificial layer 230 is removed from between reflective element 42 and conductive material 224 and dielectric layer 222. Thus, reflective element 42, including reflective surface 44 and hinges 86, is released and conductive material 224, including electrode 60, is exposed. In addition, electrical contact pad 221 of electrical contact area 202 is exposed.

In one embodiment, sacrificial layer 230 is removed by a chemical etch process. As such, conductive material 224, dielectric layer 222, conductive layer 220, and the materials of reflective element 42 are each selected so as to be resistant to the particular etchant used for removing sacrificial layer 230. In one embodiment, the etch process for removing sacrificial layer 230 is a dry etch, such as a plasma-based fluorinated etch using, for example, $SF_6$, $CF_4$, $C_2F_6$, or a combination of gases.

FIGS. 4A–4H illustrate another embodiment of forming micro-mirror device 10. As described above, substructure 200 of micro-mirror device 10 includes base material 210, dielectric layer 214, and conductive layer 220. In addition, dielectric layer 222 is formed over conductive layer 220 and conductive material 224 is deposited on dielectric layer 222 to form electrode 60.

Figure 4A:
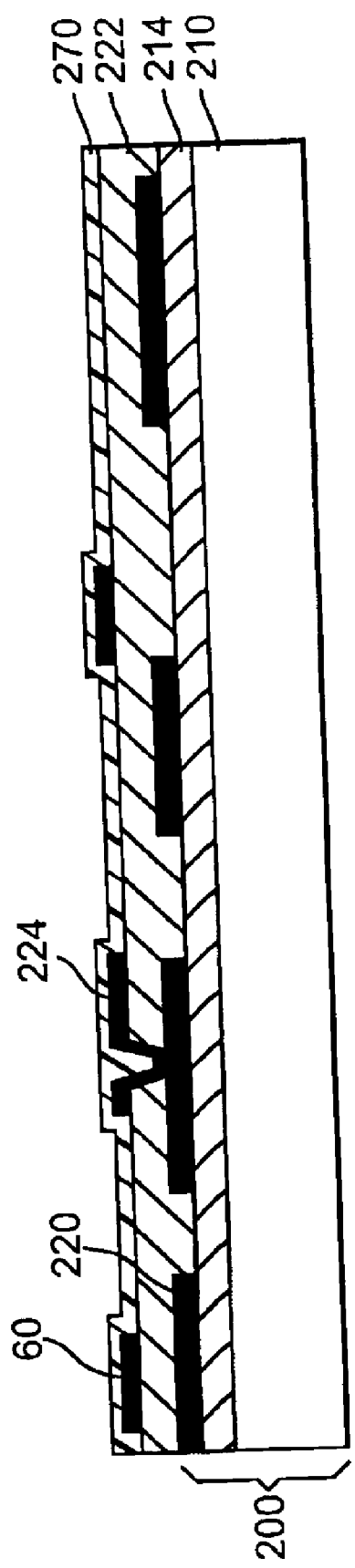
FIGS. 4A–4H illustrate another embodiment of forming a micro-mirror device according to the present invention.

In one embodiment, as illustrated in FIG. 4A, before sacrificial layer 230 is formed, a barrier layer 270 is formed over conductive material 224 and dielectric layer 222. Barrier layer 270 is provided to prevent the diffusion of conductive material 224 and/or the material of dielectric layer 222 with the material of sacrificial layer 230 during subsequent processing of micro-mirror device 10, as described below. In one embodiment, material suitable for barrier layer 270 includes, for example, titanium nitride, silicon nitride, or silicon oxide.

Figure 4B:
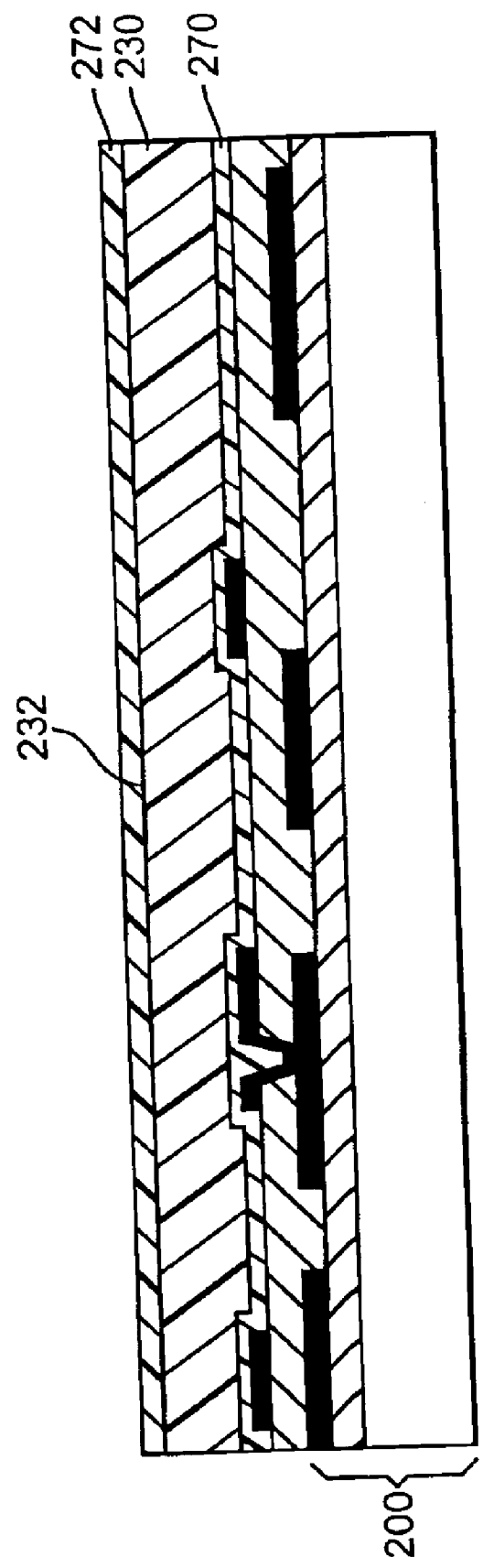

As illustrated in the embodiment of FIG. 4B, after barrier layer 270 is formed, sacrificial layer 230 is formed over barrier layer 270. In one embodiment, sacrificial layer 230 is formed by depositing a sacrificial material over barrier layer 270. As described above, the material forming sacrificial layer 230 is deposited, for example, by CVD or PECVD. In one embodiment, the material forming sacrificial layer 230 includes, for example, silicon. After the material of sacrificial layer 230 is deposited over barrier layer 270, the material is planarized to create substantially flat surface 232 of sacrificial layer 230, as described above.

In one embodiment, as illustrated in FIG. 4B, after sacrificial layer 230 is planarized, another barrier layer 272 is formed over sacrificial layer 230. Barrier layer 272 is provided to prevent the diffusion of the material of sacrificial layer 230 with the materials of reflective element 42 during subsequent processing of micro-mirror device 10, as described below. In one embodiment, material suitable for barrier layer 272 includes, for example, titanium nitride, silicon nitride, or silicon oxide.

Figure 4C:
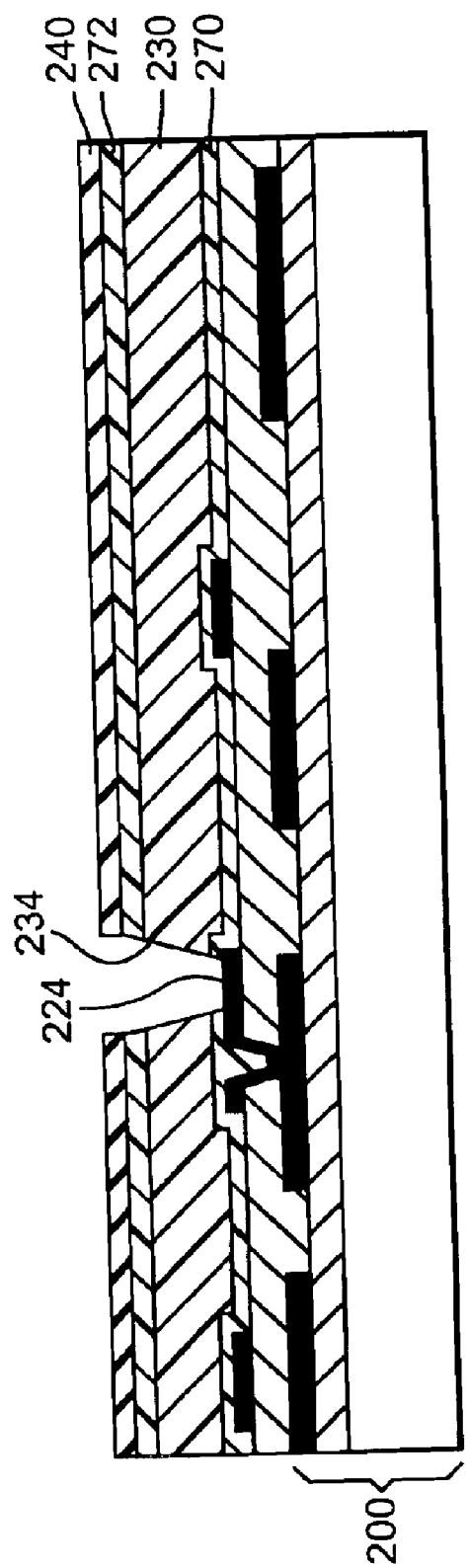

Next, as illustrated in the embodiment of FIG. 4C, mask layer 240 is formed over barrier layer 272. In one embodiment, as described above, mask layer 240 is formed by deposition and patterned, for example, by photolithography to expose an area where opening 234 is to be formed through barrier layer 272, sacrificial layer 230, and barrier layer 270 to conductive material 224. Opening 234 is formed, for example, by chemical etching, as described above. After opening 234 is formed, mask layer 240 is stripped or removed.

As illustrated in the embodiments of FIGS. 4D–4H, after opening 234 is formed through barrier layer 272, sacrificial layer 230, and barrier layer 270, and after mask layer 240 is removed, actuating element 40 is formed. In one embodiment, as described above, actuating element 40 includes reflective element 42 of micro-mirror device 10.

Figure 4D:
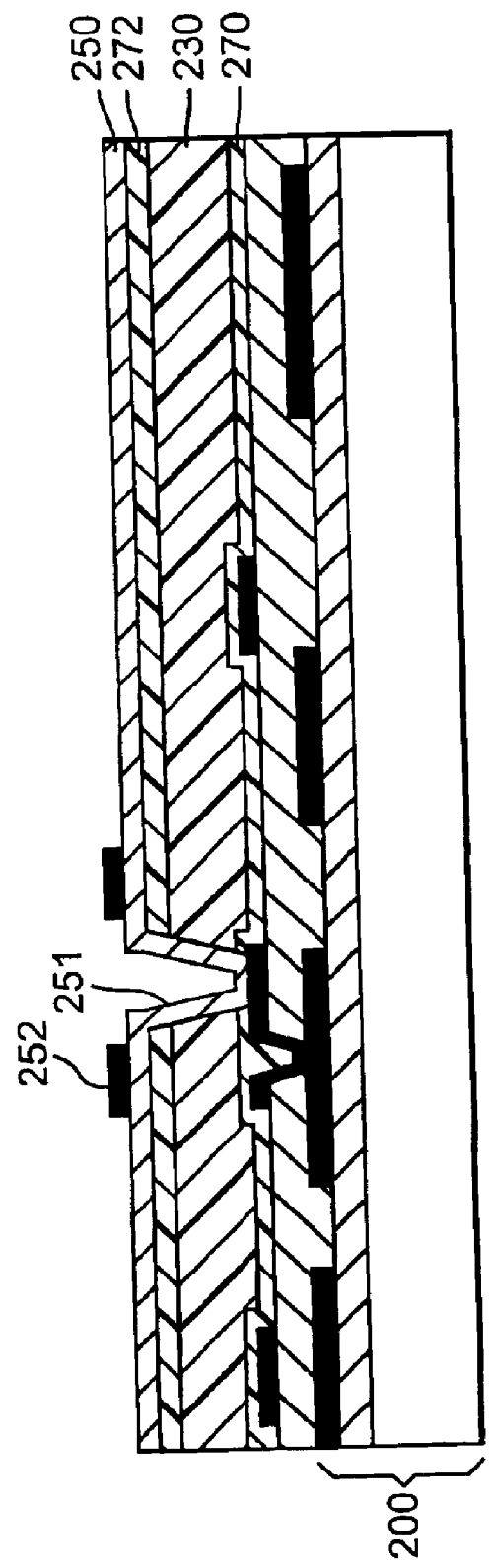

As illustrated in the embodiment of FIG. 4D, reflective element 42 is formed by depositing first material 250 over barrier layer 272 and within opening 234. In one embodiment, as described above, material deposited within opening 234 forms conductive via 251 which represents post 24 and conductive via 26 of micro-mirror device 10. In addition, material 250 represents hinge material of reflective element 42 and forms hinges 86 (FIG. 2) of micro-mirror device 10. In one embodiment, material 250 includes aluminum, as described above. Also, as illustrated in the embodiment of FIG. 4D, after material 250 is deposited over sacrificial layer 230, protective material 252 is deposited and patterned on material 250.

Figure 4E:
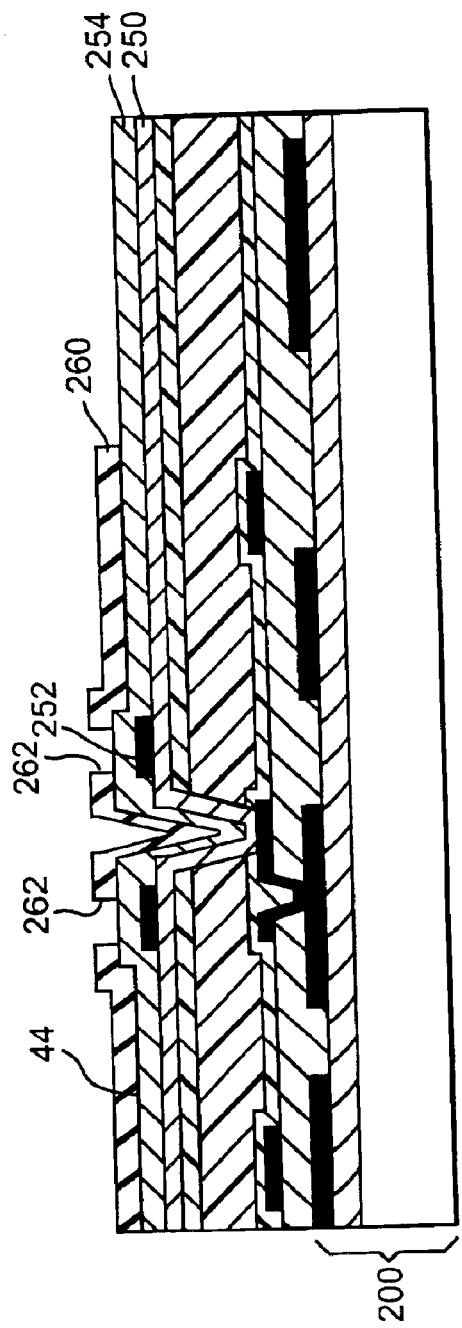

Next, as illustrated in the embodiment of FIG. 4E, reflective element 42 is further formed by depositing a second material 254 over protective material 252 and material 250. As described above, material 254 represents reflective material of reflective element 42 and forms reflective surface 44 of reflective element 42. In one embodiment, material 254 includes aluminum, as described above. Also, as illustrated in the embodiment of FIG. 4E, after material 254 is deposited over protective material 252 and material 250, mask layer 260 with openings 262 is formed over material 254.

Figure 4F:
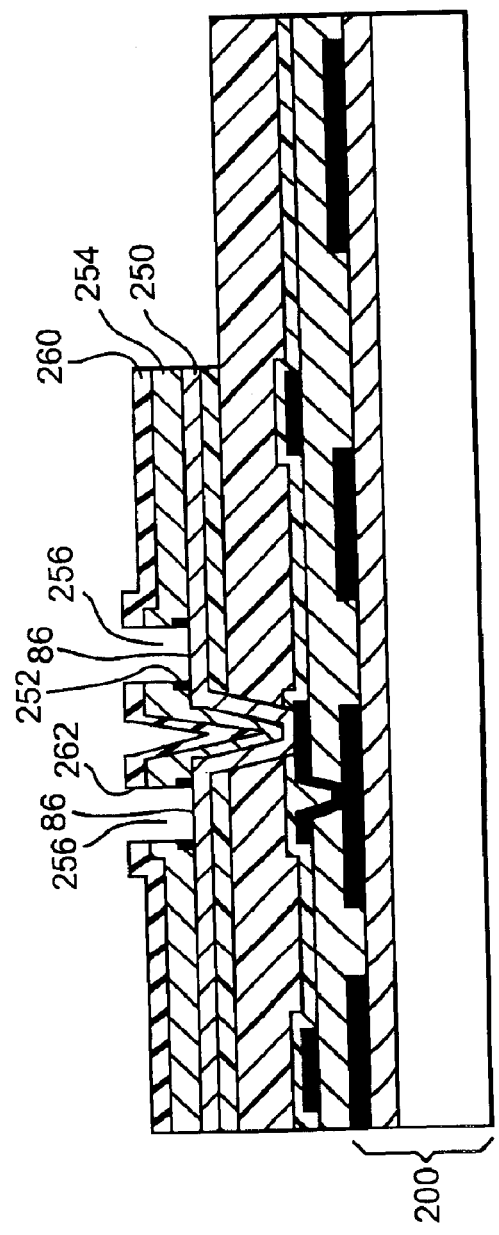

As illustrated in the embodiment of FIG. 4F, hinges 86 are formed by forming openings 256 through material 254 and protective material 252 to material 250. In one embodiment, as described above, openings 256 are formed by chemical etching through openings 262 of mask layer 260. After openings 256 are formed, mask layer 260 is stripped or removed.

Figure 4G:
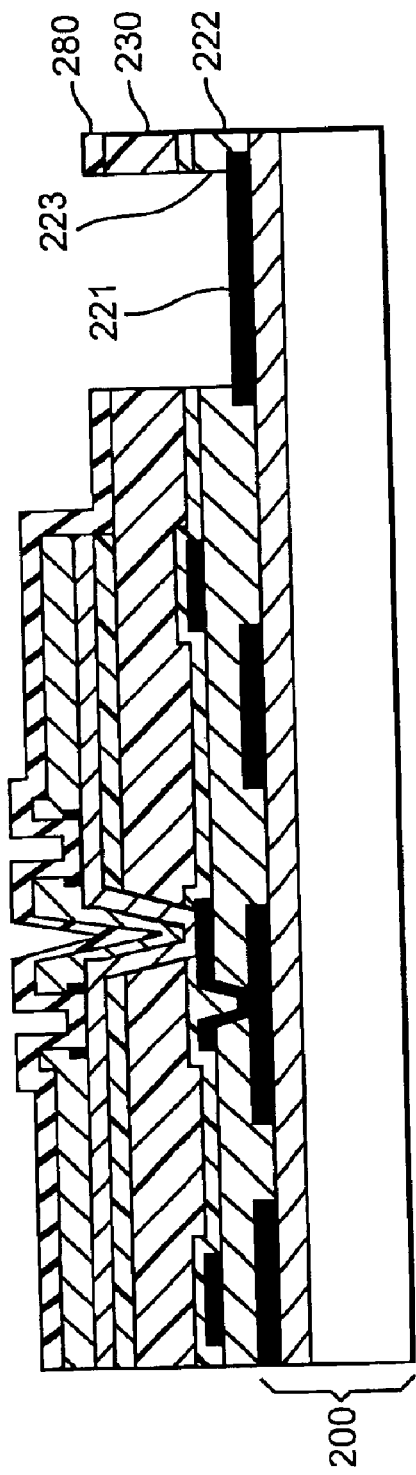

In one embodiment, as illustrated in FIG. 4G, opening 223 through dielectric layer 222 to electrical contact pad 221 is formed after reflective element 42 is formed. As such, a mask layer 280 is formed over reflective element 42 and patterned to define where opening 223 is to be formed through sacrificial layer 230 and dielectric layer 222. In one embodiment, opening 223 is formed by a chemical etch process. After opening 223 is formed, mask layer 280 is stripped or removed.

Figure 4H:
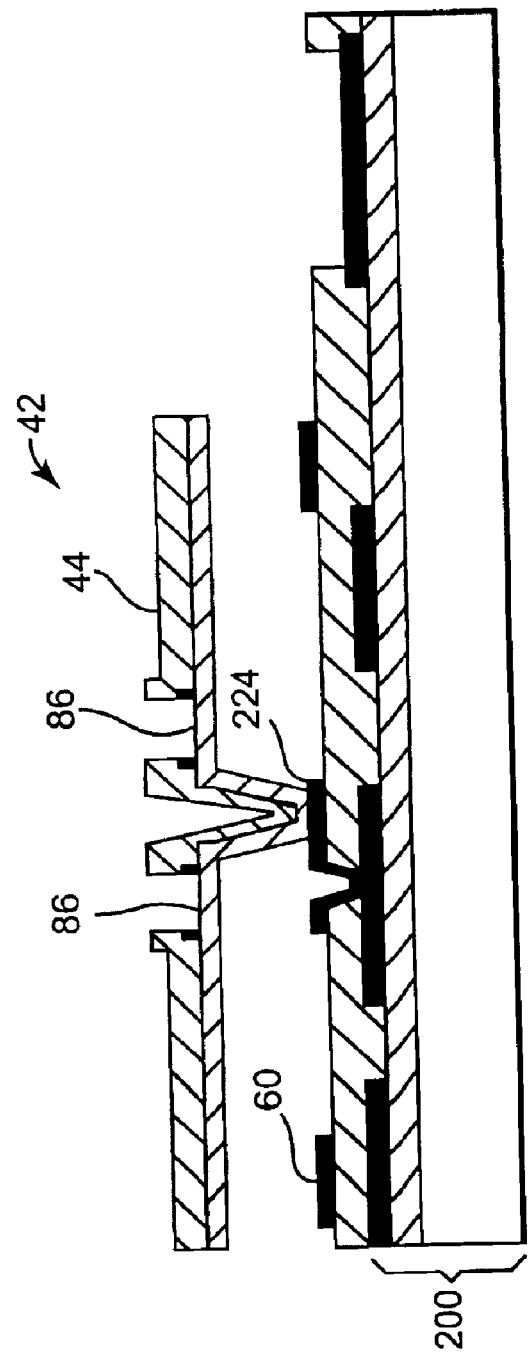

Next, as illustrated in the embodiment of FIG. 4H, sacrificial layer 230 is substantially removed. In addition, barrier layers 270 and 272 are also substantially removed. As such, reflective element 42, including reflective surface 44 and hinges 86, is released and conductive material 224, including electrode 60, is exposed. In one embodiment, sacrificial layer 230, including barrier layers 270 and 272, are removed by a chemical etch process. In one embodiment, as described above, the etch process includes a dry etch, such as a plasma-based fluorinated etch using, for example, $SF_6$, $CF_4$, $C_2F_6$, or a combination of gases.

While the above description refers to the formation of a micro-mirror device, it is understand that the above processes are also applicable to the formation of other MEMS devices, including multi-layer MEMS devices. In addition, it is understood that FIGS. 3A–3G and FIGS. 4A–4H are each schematic illustrations of one embodiment of forming a micro-mirror device according to the present invention and that the actual configuration of layers and vias of the micro-mirror device may be more complicated than that illustrated.

Figure 5:
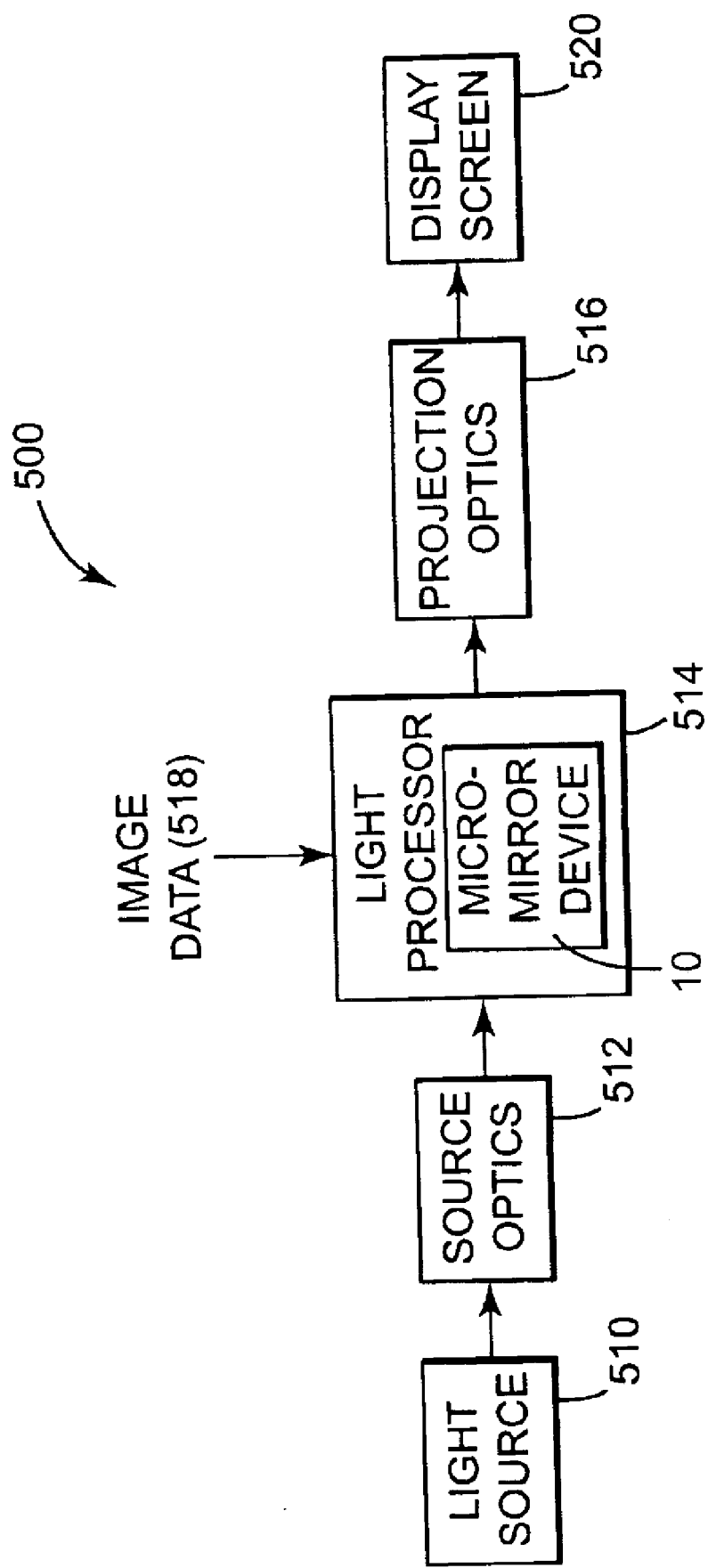
FIG. 5 is a block diagram illustrating one embodiment of a display system including a micro-mirror device according to the present invention.

In one embodiment, as illustrated in FIG. 5, micro-mirror device 10 is incorporated in a display system 500. Display system 500 includes a light source 510, source optics 512, a light processor or controller 514, and projection optics 516. Light processor 514 includes multiple micro-mirror devices 10 arranged in an array such that each micro-mirror device 10 constitutes one cell or pixel of the display.

In one embodiment, light processor 514 receives image data 518 representing an image to be displayed. As such, light processor 514 controls the actuation of micro-mirror devices 10 and the modulation of light received from light source 510 based on image data 518. The modulated light is then projected to a viewer or onto a display screen 520.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a micro-mirror device, the method comprising:
   providing a substructure including a base material and at least one conductive layer formed on a side of the base material;
   forming a layer of dielectric material over the at least one conductive layer of the substructure;
   depositing a conductive material on the layer of dielectric material, including communicating the conductive material with the at least one conductive layer of the substructure through the layer of dielectric material;
   forming a sacrificial layer of silicon over the conductive material and the layer of dielectric material;
   forming a reflective element over the sacrificial layer of silicon; and
   substantially removing the sacrificial layer of silicon between the reflective element and the layer of dielectric material.

2. The method of claim 1, wherein depositing the conductive material includes forming at least one electrode on the layer of dielectric material,
   wherein the reflective element is adapted to move in response to application of an electrical signal to the at least one electrode.

3. The method of claim 1, wherein forming the reflective element includes depositing a hinge material over the sacrificial layer of silicon, depositing and patterning a protective material over the hinge material, and depositing a reflective material over the protective material and the hinge material, and includes removing a portion of the reflective material and the protective material to expose a portion of the hinge material.

4. The method of claim 3, wherein the conductive material and at least the hinge material each include one of aluminum and an aluminum silicon alloy.

5. The method of claim 1, wherein substantially removing the sacrificial layer includes dry etching the sacrificial layer.

6. The method of claim 1, further comprising:
   forming a first layer of barrier material over the conductive material and the layer of dielectric material,
   wherein forming the sacrificial layer includes forming the sacrificial layer over the first layer of barrier material, and wherein substantially removing the sacrificial layer includes substantially removing the sacrificial layer and the first layer of barrier material between the reflective element and the layer of dielectric material.

7. The method of claim 6, wherein the barrier material includes one of titanium nitride, silicon nitride, and silicon oxide.

8. The method of claim 6, further comprising:
   forming a second layer of barrier material over the sacrificial layer of silicon,
   wherein forming the reflective element includes forming the reflective element over the second layer of barrier material, and
   wherein substantially removing the sacrificial layer includes substantially removing the second layer of barrier material, the sacrificial layer, and the first layer of barrier material between the reflective element and the layer of dielectric material.

9. The method of claim 8, wherein the barrier material includes one of titanium nitride, silicon nitride, and silicon oxide.

10. The method of claim 1, further comprising:
    defining an electrical contact area for the micro-mirror device, including forming an opening through the dielectric layer to the at least one conductive layer of the substructure.

11. The method of claim 1, wherein the substructure includes a complementary metal oxide semi-conductor structure.

12. The method of claim 1, wherein the base material of the substructure includes silicon and the at least one conductive layer of the substructure includes aluminum.

13. The method of claim 1, wherein the dielectric material includes silicon oxide.

14. A micro-mirror device, comprising:
- a substructure including a base material and at least one conductive layer formed on a side of the base material;
- a dielectric layer formed over the at least one conductive layer of the substructure;
- at least one electrode formed on the dielectric layer; and
- a reflective element extended over the dielectric layer and the at least one electrode, the reflective element including a hinge material and a reflective material formed on the hinge material,
- wherein the reflective element is adapted to move in response to application of an electrical signal to the at least one electrode.

15. The device of claim 14, wherein the hinge material of the reflective element is adapted to flex to move the reflective element.

16. The device of claim 14, further comprising:
- an electrical contact area including an opening formed through the dielectric layer to the at least one conductive layer of the substructure.

17. The device of claim 14, further comprising:
- a sacrificial layer of silicon formed over the dielectric layer and the at least one electrode,
- wherein the reflective element is formed over the sacrificial layer, and wherein the sacrificial layer is adapted to be removed by an etch process after the reflective element is formed.

18. The device of claim 17, wherein the etch process includes a dry etch process.

19. The device of claim 17, further comprising:
- a first barrier layer formed over the dielectric layer and the at least one electrode,
- wherein the sacrificial layer is formed over the first barrier layer, and wherein the sacrificial layer and the first barrier layer are adapted to be removed by the etch process after the reflective element is formed.

20. The device of claim 19, wherein the first barrier layer includes one of titanium nitride, silicon nitride, and silicon oxide.

21. The device of claim 19, further comprising:
- a second barrier layer formed over the sacrificial layer of silicon,
- wherein the reflective element is formed over the second barrier layer, and wherein the second barrier layer, the sacrificial layer, and the first barrier layer are adapted to be removed by the etch process after the reflective element is formed.

22. The device of claim 21, wherein the first barrier layer and the second barrier layer each include one of titanium nitride, silicon nitride, and silicon oxide.

23. The device of claim 14, wherein the substructure includes a complementary metal oxide semi-conductor structure.

24. The device of claim 14, wherein the base material of the substructure includes silicon and the at least one conductive layer of the substructure includes aluminum.

25. The device of claim 14, wherein the dielectric layer includes silicon oxide.

26. A display device including the micro-mirror device of claim 14.

27. A micro-mirror device, comprising:
- a substructure including a base material and at least one conductive layer formed on a side of the base material;
- a dielectric layer formed over the at least one conductive layer of the substructure;
- at least one electrode formed on the dielectric layer; and
- a reflective element extended over the dielectric layer and the at least one electrode, including means formed in the reflective element for facilitating movement of the reflective element in response to application of an electrical signal to the at least one electrode.

28. The device of claim 27, wherein means formed in the reflective element for facilitating movement of the reflective element includes a hinge material and a reflective material formed on the hinge material, wherein the hinge material is adapted to flex to facilitate movement of the reflective element.

29. The device of claim 27, further comprising:
- means for forming the reflective element over the dielectric layer and the at least one electrode, including a sacrificial layer of silicon formed over the dielectric layer and the at least one electrode,
- wherein the reflective element is formed over the sacrificial layer, and the sacrificial layer is removed after the reflective element is formed.

30. The device of claim 29, further comprising:
- means for protecting the dielectric layer and the at least one electrode from the sacrificial layer of silicon; and
- means for protecting the reflective element from the sacrificial layer of silicon.

31. The device of claim 30, wherein means for protecting the dielectric layer and the at least one electrode includes a first barrier layer formed over the dielectric layer and the at least one electrode, and wherein means for protecting the reflective element includes a second barrier layer formed over the sacrificial layer of silicon,
- wherein the sacrificial layer is formed over the first barrier layer, and the reflective element is formed over the second barrier layer, and wherein the second barrier layer, the sacrificial layer of silicon, and the first barrier layer are removed after the reflective element is formed.

* * * * *